US005672993A

United States Patent [19]

Runaldue

[11] Patent Number: 5,672,993

[45] Date of Patent: Sep. 30, 1997

[54] CMOS CURRENT MIRROR

[75] Inventor: Thomas J. Runaldue, San Jose, Calif.

[73] Assignee: Advanced Micro Devices, Inc., Sunnyvale, Calif.

[21] Appl. No.: 601,898

[22] Filed: Feb. 15, 1996

[51] Int. Cl.[6] .......... H03K 17/62

[52] U.S. Cl. .......... 327/404; 327/403; 323/315

[58] Field of Search .......... 323/312, 313, 323/315; 327/403, 404, 530, 538, 540, 541, 543, 416, 434

[56] References Cited

U.S. PATENT DOCUMENTS

| | | | |
|---|---|---|---|
| 4,454,467 | 6/1984 | Sakaguchi | 323/313 |
| 4,697,154 | 9/1987 | Kousaka et al. | 330/277 |
| 5,012,133 | 4/1991 | Hughes | 307/352 |
| 5,109,187 | 4/1992 | Guliani | 323/313 |
| 5,173,656 | 12/1992 | Seevinck et al. | 323/314 |
| 5,245,273 | 9/1993 | Greaves et al. | 323/313 |
| 5,257,039 | 10/1993 | Chung et al. | 346/107 R |
| 5,481,179 | 1/1996 | Keeth | 323/315 |
| 5,517,103 | 5/1996 | Ng et al. | 323/315 |

FOREIGN PATENT DOCUMENTS

| | | |
|---|---|---|
| 0373471 | 6/1990 | European Pat. Off. . |
| 0531615 | 3/1993 | European Pat. Off. . |
| 4326282 | 2/1995 | Germany . |

OTHER PUBLICATIONS

Choi, T.C. et al. –"High Frequency CMOS Switched–Capacitor Filters for Communications Application," IEEE Journal of Solid–State Circuits, vol. SC–18, No. 6, Dec. 1983, pp. 652–664.

Song, B.S. et al. –"Switched–Capacitor High–Q Bandpass Filters for IF Applications," IEEE Journal of Solid–State Circuits, vol. SC–21, No. 6, Dec. 1986, pp. 924–933.

*Primary Examiner*—Timothy P. Callahan
*Assistant Examiner*—Jung Ho Kim
*Attorney, Agent, or Firm*—Davis Chin

[57] ABSTRACT

A current mirror circuit for mirroring current in CMOS integrated circuit technology includes a current mirror arrangement formed of first and second P-channel MOS transistors (MP32,MP33), a variable input current source ($I_{CS}$), a first source follower transistor (MN34), a second source follower transistor (MP35), a current-sinking transistor (MN31), and a load circuit 212. The load circuit is formed of a load transistor (MN36) and a load resistor (R1). In an alternate embodiment, the load circuit is formed of a single load resistor. As a result, the amount of current injected into the first P-channel MOS transistor (MP32) is more precisely mirrored into the second P-channel MOS transistor (MP33).

18 Claims, 3 Drawing Sheets

CM OS CURRENT MIRROR

BACKGROUND OF THE INVENTION

This invention relates generally to current mirror circuits and more particularly, it relates to an improved current mirror circuit for mirroring current in CMOS integrated circuit technology on a more accurate and reliable basis.

Heretofore, there is known in the prior art of a conventional current mirror circuit for mirroring current in CMOS technology which is illustrated in FIG. 1 and labeled "Prior Art." The current mirror circuit 10 includes a current mirror arrangement formed of first and second P-channel MOS transistors MP12 and MP13, a load N-channel MOS transistor MN11, and an input current source $I_{CS}$. The gates of the first and second P-channel transistors MP12 and MP13 are connected together and to the drain of the first P-channel transistor MP12. The drain of the first P-channel transistor MP12 is also connected to the node N11. The drain of the second P-channel transistor MP13 is connected to the node N12. The sources of the first and second P-channel transistors MP12 and MP13 are connected to a power supply voltage or potential VCC, which is typically at approximately +5.0 volts or lower (i.e., +3.3 volts). The input current source $I_{CS}$ has its one end connected also to the drain of the first P-channel transistor MP12 and its other end connected to a ground potential VSS, which is typically at zero volts. The gate and drain of the N-channel transistor MN11 are connected together and to the node N12. The source of the N-channel transistor MN11 is connected to the ground potential VSS.

An output stage 12 of a current source driver is formed of a P-channel current-sourcing transistor MP2 and an N-channel current-sinking transistor MN1. The node N11 from the current mirror circuit 10 is connected to the gate of the P-channel transistor MP2 so as to produce again a mirrored current. Similarly, the node N12 from the current mirror circuit 10 is connected to the gate of the N-channel transistor MN1 so as to produce again a mirrored current.

In FIG. 2, there is shown a plot of the drain current $I_{DS}$ of an N-channel MOS transistor versus the drain-to-source voltage $V_{DS}$ for various gate-to-source $V_{GS}$ voltages. This plot illustrates the typical I/V characteristic curves for operation of the N-channel MOS transistor. For a P-channel MOS transistor, the curves will be identical in form, but the voltages $V_{DS}$ and $V_{GS}$ will be negative rather than positive. It will be appreciated that the curves for the various voltages $V_{GS}$ is not a flat line, but gradually ramps up with increasing drain-to-source voltages. In other words, for a given fixed voltage $V_{GS}$, the drain current $I_{DS}$ will become larger and larger as the voltage across the drain-to-source increases.

Referring back to FIG. 1, the operation of the current mirror circuit 10 will now be explained. The current source $I_{CS}$ is injected or sourced to the node N11, which is the common gates of the P-channel transistors MP12 and MP13. This creates a voltage on the node N11 (the gate of transistor MP12) which will decrease until the current flowing through the source/drain conduction path of the P-channel transistor MP12 equals the amount of the input current supplied by the current source $I_{CS}$. Since the voltage at which the node N11 is being operated is also applied to the gate of the P-channel transistor MP13, the transistor MP13 will conduct the same amount of current therethrough as the transistor MP12 if the two transistors are identical (i.e., have the same I/V characteristic curves). Thus, the current flowing in the transistor MP12 will be mirrored to the transistor MP13.

The current flowing in the P-channel transistor MP13 will be sourced to the node N12, causing its potential to rise until the N-channel transistor MN11 conducts the same amount of current that the P-channel transistor MP13 is injecting. Accordingly, if the node N12 is further connected to identical N-channel transistors MN11 and MN1, then the current-sinking transistor MN1 will conduct the same amount of current as the N-channel transistor MN11. Therefore, the node N12 will produce a mirrored current into the N-channel transistors MN11 and MN1.

However, this conventional current mirror circuit 10 suffers from the disadvantage of not being able to provide a high accuracy in the amount of current being mirrored. As will be noted, if a larger voltage is applied across the source/drain conduction path of the P-channel transistor MP13 than the P-channel transistor MP12, then there will be a larger and unequal amount of current being mirrored to the load transistor MN11. In particular, the load transistor MN11 will be mirroring more current than the amount of current flowing in the P-channel transistor MP12 due to the different drain-to-source voltages $V_{DS}$ applied to the respective current mirror transistors MP12 and MP13. As a consequence, the current-sinking transistor MN11 in the output stage 12 of the current source driver will conduct more current than the current-sourcing transistor MP2 whose gate is connectable to the node N11 so as to produce a mirrored current.

There has also been an attempt made in the prior art to solve this deficiency by adding a cascode transistor stage in series with the first and second current mirror transistors. A prior art cascode current mirror circuit 110 utilizing this technique is depicted in FIG. 3. As can be seen, the only difference between the conventional current mirror circuit 10 of FIG. 1 and the cascode current mirror circuit 110 of FIG. 3 is the addition of a second current mirror arrangement formed of third and fourth P-channel MOS transistors MP24 and MP25 which are connected in series with the first and second P-channel transistors MP22 and MP23, respectively. In operation, these third and fourth P-channel transistors MP24 and MP25 serve to maintain the drain-to-source voltages applied across the first and second P-channel MOS transistors MP22 and MP23 to be equal. Since both the transistors MP22 and MP23 have the same gate voltages applied thereto (i.e., the common node N21) then the current injected into the first P-channel transistor MP22 will be mirrored equally to the second P-channel transistor MP23. Further, the current flowing in the load transistor MN21 will be the same as the amount of current flowing in the P-channel transistor MP23, which is in turn also the same amount of current as injected into the P-channel transistor MP22 by the input current source $I_{CS}$. Therefore, the respective current-sourcing and current-sinking transistors MP2 and MN1 will conduct the same exact amount of current.

Nevertheless, this prior art cascode current mirror circuit 110 is not without any drawbacks. One problem that exists is that the voltage drop across the two series-connected P-channel transistors MP22 and MP24 must be equal to at least two threshold voltage drops ($2\ V_t$) before they are able to conduct. On the other hand, there is required only one threshold voltage drop ($1\ V_t$) across the P-channel transistor MP12 in the current mirror circuit 10 of FIG. 1. In practice, it has been found that the nominal voltages at the respective nodes N11 and N21 must be on the order of 500 mV to 1 volt higher than the threshold voltage drop $V_t$ of the transistor. As defined herein, the threshold voltage drop $V_t$ of a transistor is the voltage applied across the gate-to-source electrodes at the onset of conduction.

For the purpose of illustration, with a 5 volt power supply if it is assumed that each of the threshold voltages of the corresponding transistors MP22 (MP12) and MP24 is 1 volt, then the voltage on the node N23 must decrease by +2.5 V to +3.0 V before conduction occurs. This increased voltage drop causes the input current source $I_{CS}$ to be restricted or limited in its operation with a low voltage swing. In addition, for a power supply potential of +3.3 volts, the input current source may be constrained to a voltage range in which the current mirror circuit 110 is impractical or inoperable. On the other hand, the voltage on the node N11 (FIG. 1) is required to decrease only by +1.5 V to +2.0 V before conduction occurs, thereby increasing the voltage headroom. Moreover, another problem encountered in the prior art cascode current mirror circuit 110 was that the added third and fourth P-channel transistors MP24 and MP25 caused parasitic capacitances to be connected to the input current source $I_{CS}$, thereby decreasing the response time thereof at higher frequencies.

Accordingly, it would be desirable to provide an improved current mirror circuit for mirroring current with high precision and accuracy, but yet without increasing the threshold voltage drops. The present invention provides a current mirror circuit which combines the current mirror accuracy of the cascode current mirror circuit of FIG. 3 with the low threshold voltage drop of the conventional current mirror circuit of FIG. 1.

SUMMARY OF THE INVENTION

Accordingly, it is a general object of the present invention to provide an improved current mirror circuit which is relatively simple and economical to manufacture and assemble, but yet overcomes the disadvantages of the prior art current mirror circuits.

It is an object of the present invention to provide an improved current mirror circuit for mirroring current in CMOS integrated circuit technology on a more accurate and reliable basis.

It is another object of the present invention to provide an improved current mirror circuit which permits low voltage current mirroring and improves linearity.

It is still another object of the present invention to provide an improved current mirror circuit which includes first and second P-channel current mirror transistors, an input current source means, a first source follower transistor, a second source follower transistor, and a load circuit so as to provide precision current mirroring.

In accordance with these aims and objectives, the present invention is concerned with the provision of a current mirror circuit for mirroring current in CMOS integrated circuit technology which includes a current mirror arrangement formed of first and second P-channel MOS transistors. The gates of the first and second P-channel MOS transistors are connected together and to the drain of the first P-channel MOS transistor. The first P-channel MOS transistor has its source connected to a power supply potential and its drain connected to a first node. The second P-channel MOS transistor has its source connected to the power supply potential and its drain connected to a second node. An input current source means is used for generating a variable current at the first node.

A first source follower transistor has its gate connected to the first node, its drain connected to the power supply potential, and its source connected to a third node. A second source follower transistor has its source connected to the second node, its gate connected to the third node, and its drain connected to a fourth node. A current-sinking transistor has its gate and drain connected together and to the fourth node and its source connected to a ground potential. A load circuit is interconnected between the third node and the ground potential for receiving current from the first source follower transistor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 4:
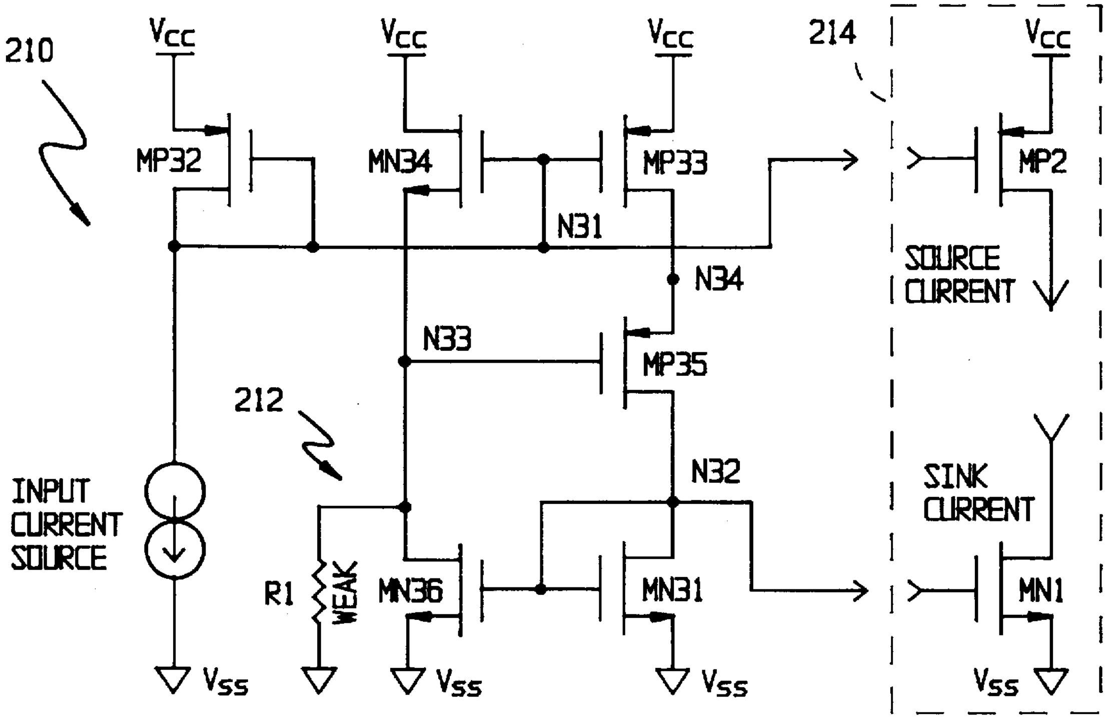
FIG. 4 is a schematic circuit diagram of an improved current mirror circuit, constructed in accordance with the principles of the present invention.

Referring now in detail to the drawings, there is shown in FIG. 4 a schematic circuit diagram of an improved current mirror circuit 210, constructed in accordance with the principles of the present invention. The current mirror circuit 210 of the present invention provides for mirroring current in CMOS integrated circuit technology on a more accurate and reliable basis. The current mirror circuit 210 provides for both the sourcing and the sinking of current from a single input current source. The instant current mirror circuit 210 has particular application for use with an output stage of a differential current source driver in a network communication physical layer CMOS integrated circuit device. For example, the current mirror circuit 210 is used especially in a quad integrated Ethernet transceiver manufactured by Advanced Micro Devices, Inc. under their Part No. AMD 79C988.

Figure 1:
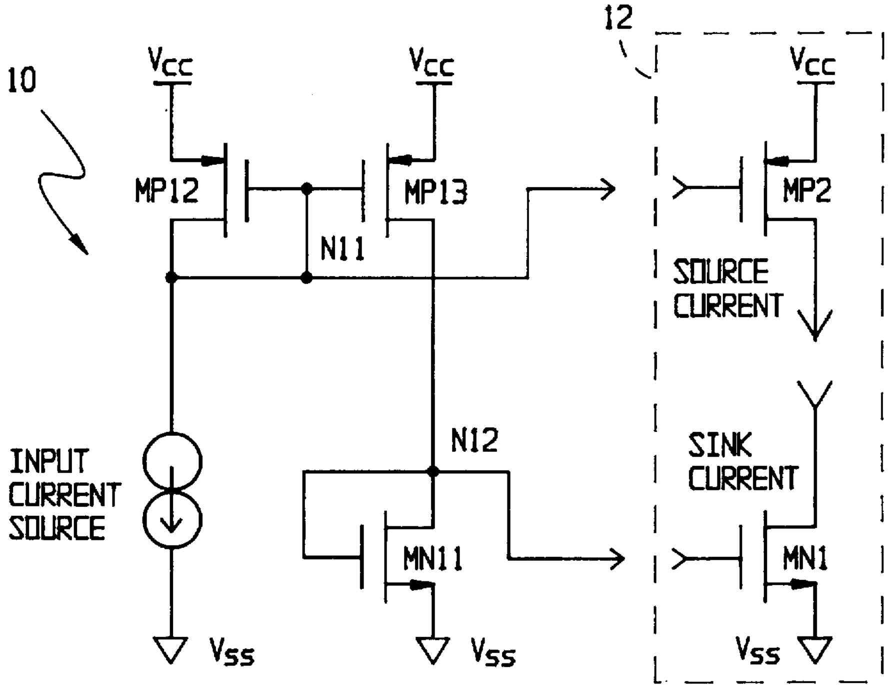
FIG. 1 (PRIOR ART)
FIG. 1 is a schematic circuit diagram of a conventional current mirror circuit of the prior art.
Figure 2:
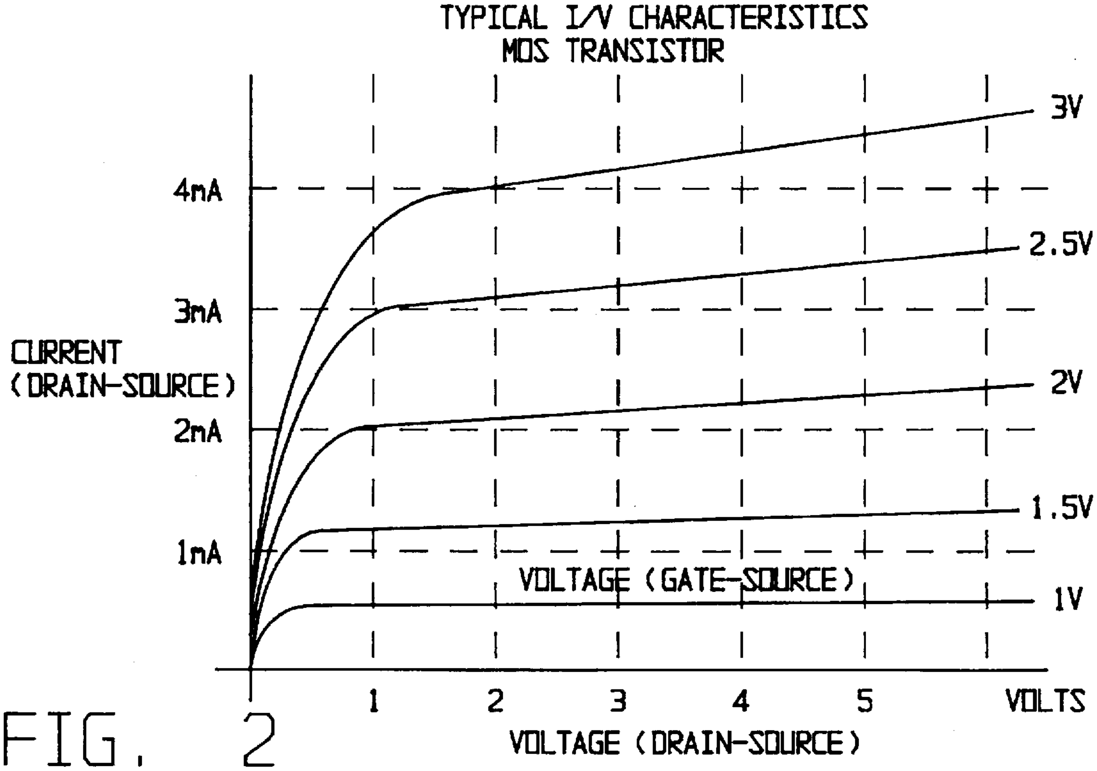
FIG. 2 illustrates typical I/V characteristic curves for an N-channel MOS transistor.
Figure 3:
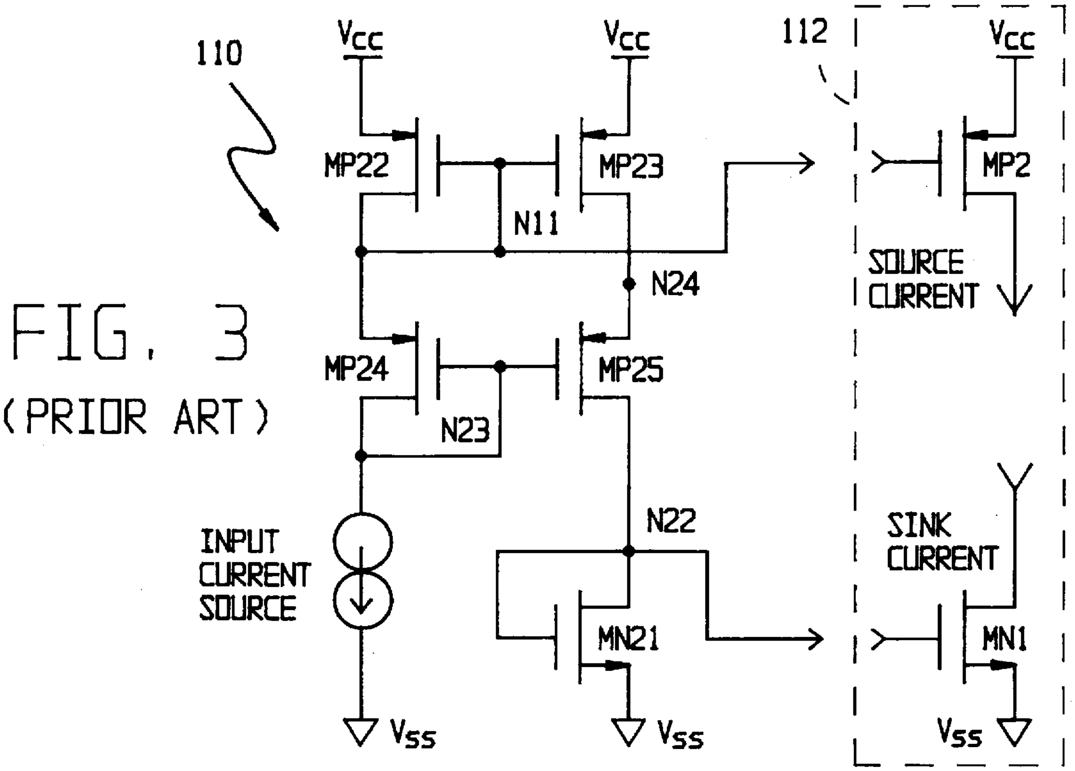
FIG. 3 (PRIOR ART)
FIG. 3 is a schematic circuit diagram of a cascode current mirror circuit of the prior art.

The current mirror circuit 210 is comprised of a current mirrorarrangement formed of first and second P-channel MOS current mirror transistors MP32 and MP33, a load N-channel MOS transistor MN31, and a variable input current source $I_{CS}$. These components are identical to those used in the respective current mirror circuits 10 and 110 of FIGS. 1 and 3. In addition, the current mirror circuit 210 includes an N-channel MOS transistor MN34 functioning as a first source follower, a P-channel MOS transistor MP35 functioning as a second source follower, and a second load circuit 212.

The gates of the first and second P-channel MOS transistors MP32 and MP33 are connected together and to the drain of the first P-channel transistor MP32. The drain of the first P-channel transistor MP32 is also connected to a node N31. The drain of the second P-channel transistor MP33 is connected to a node N34. The sources of the first and second P-channel transistors MP32 and MP33 are connected to a power supply voltage or potential VCC, which is at approximately +5.0 volts or lower (i.e., +3.3 volts). The variable input current source $I_{CS}$ has its one end connected to the drain of the first P-channel transistor MP32 and its other end connected to a ground potential VSS, which is typically at zero volts. The gate and drain of the load transistor MN31 are connected together and to a node N32. The source of the load transistor MN31 is also connected to the ground potential VSS.

The first source follower transistor MN34 has its drain connected to the power supply potential VCC, its gate connected to the gates of the transistors MP32 and MP33 via the node N31, and its source connected to a node N33. The second source follower transistor MP35 has its source connected to the drain of the transistor MP33 via the node N34, its gate connected to the source of the first source follower transistor MN34 via the node N33, and its drain connected to the drain and gate of the load transistor MN31 via the node N32.

The second load circuit 212 includes an N-channel MOS transistor MN36 and a load resistor R1. The N-channel transistor MN36 has its drain connected to the source of the first source follower transistor MN34 via the node N33, its gate connected to the gate of the load transistor MN31 and the node N32, and its source connected to the ground potential VSS. One end of the load resistor R1 is connected to the drain of the transistor MN36, and the other end thereof is connected to the ground potential VSS. The resistor R1 is selected to be of a certain value, which can be formed on a chip without occupying a large amount of space. Typically, the value of the resistor R1 is approximately 100K ohms. In an alternative embodiment, the second load circuit 212 may be formed of a single resistor. However, the transistor MN36 functioning as an active load for the first source follower transistor MN34 is preferred over the single resistor due to the fact that since the current flowing through the transistor MN36 will be changed by a proportional amount when the input current source $I_{CS}$ is varied.

An output stage 214 of a current source driver is formed of a P-channel current-sourcing transistor MP2 and an N-channel current-sinking transistor MN1. The node N31 of the current mirror circuit 210 is coupled to the gate of the current-sourcing transistor MP2 so as to produce a precise mirrored current. Likewise, the node N32 is coupled to the gate of the current-sinking transistor MN1 so as to produce a precise mirrored current.

In operation, the input current source $I_{CS}$ sources a varying current to the node N31 and through the P-channel transistor MP32. This will create a mirrored voltage on the node N31 which is mirrored to the gates of the output current mirror transistor MP33 and the first source follower transistor MN34 as well as to the gate of the current-sourcing transistor MP2 in the output stage 214. The current flowing in the current mirror transistor MP33 will be fed through the cascoded P-channel transistor MP35 to the load transistor MN31. The load transistor MN31 functions as a current-sinking transistor. The cascode transistor MP35 serves to maintain the voltage at the drain (node N34) of the output current mirror transistor MP33 to be the same as the voltage on the gate (node N31) of the first source follower transistor MN34. The voltage on the drain of the output current mirror transistor MP33 is controlled by the first source follower transistor MN34.

Since the transistor MN34 is functioning as a source follower, the voltage on the source (node N33) thereof will be substantially equal to one threshold voltage drop $V_t$ below the voltage at the gate (node N31) of the output current mirror transistor MP33. In addition, since the transistor MP35 is also functioning as a source follower, the voltage on the source (node N34) thereof will be substantially equal to one threshold voltage drop $V_t$ above the voltage at the source (node N33) of the first source follower transistor MN34. Therefore, if the voltage on the node N33 is at one threshold voltage drop below the voltage on the node N31 and the voltage on the node N34 is one threshold voltage above the voltage on the node N33, then the voltages on the respective nodes N31 and N34 are substantially equal to each other.

Consequently, when the voltages on the nodes N31 and N34 are made equal the current mirrored from the current mirror transistor MP32 to the current mirror transistor MP33 and in turn to the current-sourcing transistor MP2 will be equal. Likewise, the mirrored current flowing through the output current mirror transistor MP33 will be flowing also through the current-sinking transistor MN31 and will be in turn mirrored to the current-sinking transistor MN1 in the output stage. Thus, the current being sourced and the current being sunk in the output stage 214 will be equal.

Figure 5:
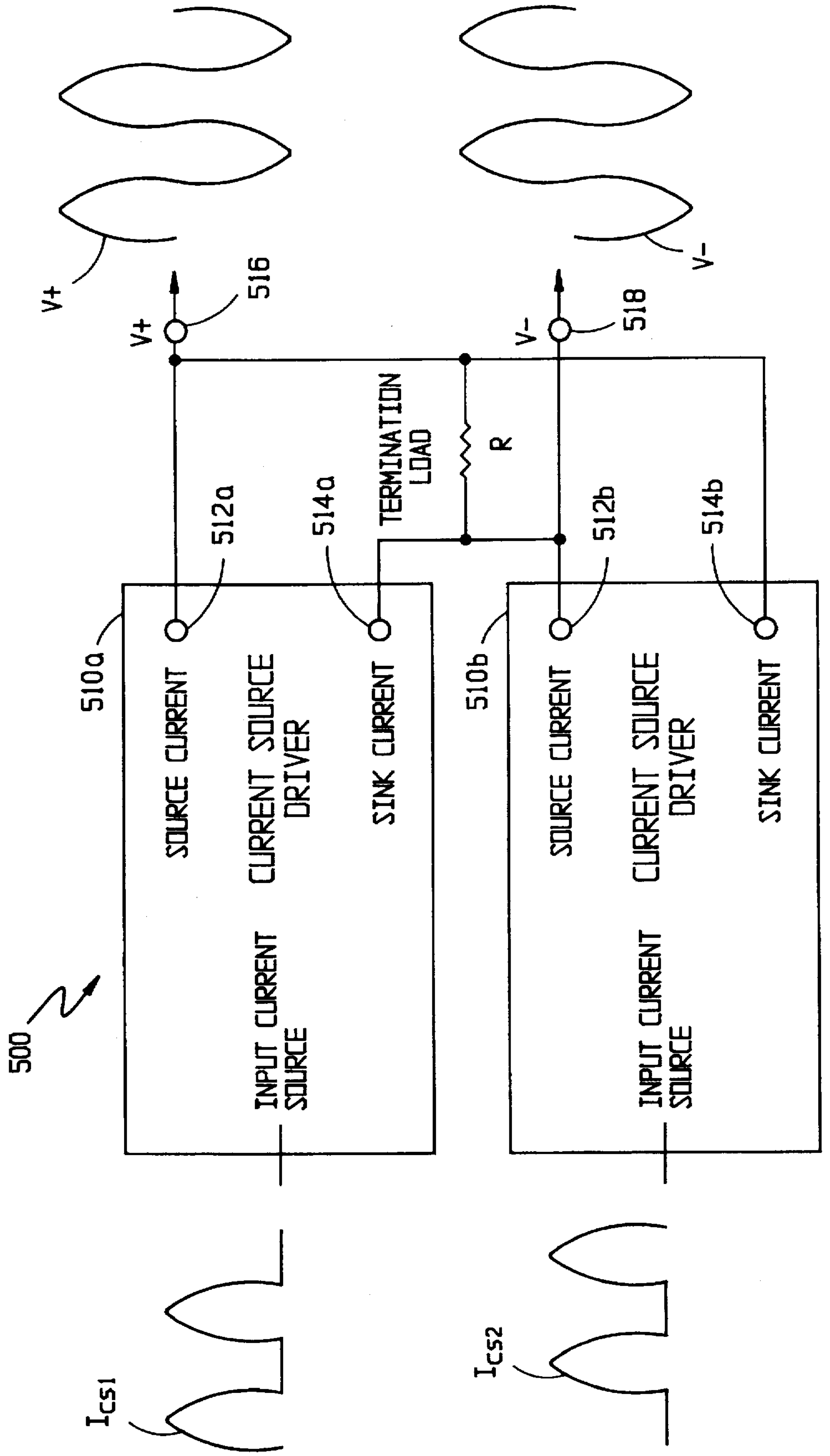
FIG. 5 is a block diagram of a differential current source driver, utilizing two identical current mirror circuits 210 and output stages 214 combination of FIG. 4 so as to drive a load in a differential manner.

In FIG. 5, there is shown in block diagram form a differential current driver 500 for use in a network communication physical layer CMOS integrated circuit device. The differential current driver 500 is comprised of two identical current source drivers **510*a*, 510*b* each consisting of the current mirror circuit 210 and output stage 214 combination in FIG. 4 for driving a termination load R in a differential manner. The current source driver 510*a* has a variable input current source $I_{CS1}$ whose waveform is shown, a source current terminal 512*a*, and a sink current terminal 514*a*. The terminal 512*a* is connected to the drain of the current-sourcing transistor MP2 (FIG. 4) and to a first output terminal 516 for generating an output voltage $V_+$ whose waveform is shown. Similarly, the current source driver 510*b* has a variable input current source $I_{CS2}$ whose waveform is shown, a source current terminal 512*b*, and a sink current terminal 514*b*. The terminal 512*b* is connected to the source of the current-sinking transistor MN1 (FIG. 4) and to a second output terminal 518** for generating an output voltage $V_-$ whose waveform is shown.

It can be seen that each of the variable input current sources is a half-wave rectified current, which is phase shifted 90° apart. Further, the output voltage $V_+$ is a sinusoidal output voltage, and the output voltage $V_-$ is a sinusoidal output voltage which is identical to, but inverted from the output voltage $V_+$. Therefore, the common mode voltage across the first and second output terminals 516 and 518 will be zero at any given time. However, if the current-sinking transistor MN1 were to be conducting more current than the current-sourcing transistor MP2, due to unequal amount of currents being mirrored thereto, then there would be created a common mode voltage applied to the termination load R, which causes problems to occur when driving differentially the line.

From the foregoing detailed description, it can thus be seen that the present invention provides an improved current mirror circuit for mirroring current in CMOS integrated circuit technology on a more accurate and reliable basis. The improved current mirror circuit of the present invention operates with a low threshold overhead like that of the conventional current mirror but yet maintains the precision current mirroring of the cascoded current mirror circuit. Further, the present current mirror circuit has reduced capacitive parasitics over the cascoded current mirror circuit since only one additional transistor is connected to the common node of the input current source.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A current mirror circuit for mirroring current in CMOS integrated circuit technology, comprising:

a current mirror arrangement being formed of first and second P-channel MOS transistors (MP32,MP33), the gates of said first and second P-channel MOS transistors (MP32,MP33) being connected together and to the drain of said first P-channel MOS transistor (MP32), said first P-channel MOS transistor (MP32) having its source connected to a power supply potential and its drain connected to a first node (N31), said second P-channel MOS transistor (MP33) having its source connected to the power supply potential and its drain connected to a second node (N34);

input current source means ($I_{CS}$) for generating a variable current at said first node (N31);

a first source follower transistor (MN34) having its gate connected to the first node (N31), its drain connected to the power supply potential, and its source connected to a third node (N33);

a second source follower transistor (MP35) having its source connected to the second node (N34), its gate connected to the third node (N33), and its drain connected to a fourth node (N32);

a current sinking transistor (MN31) having its gate and drain connected together and to the fourth node (N32) and its source connected to a ground potential; and load circuit means (212) interconnected between the third node (N33) and the ground potential for receiving current from said first source follower transistor (MN34).

2. A current mirror circuit as claimed in claim 1, wherein said second source follower transistor (MP35) serves to maintain voltages at the first and second nodes (N31,N34) to be substantially equal so as to precisely mirror current from said first P-channel MOS transistor (MP32) to said second P-channel MOS transistor (MP33).

3. A current mirror circuit as claimed in claim 1, wherein said load circuit means (212) is comprised of a load transistor (MN36) functioning as a current-sinking transistor and a load resistor (R1).

4. A current mirror circuit as claimed in claim 3, wherein said load transistor (MN36) has its drain connected to the third node (N33), its gate connected to the fourth node (N32), and its source connected to the ground potential, said load resistor (R1) having its one end connected to the third node (N33) and its other end connected to the ground potential.

5. A current mirror circuit as claimed in claim 1, wherein said load circuit means (212) is comprised of a single load resistor.

6. A current mirror circuit as claimed in claim 1, further comprising an output stage formed of a current-sourcing transistor (MP32) and a current-sinking transistor (MN1), said current-sourcing transistor (MP2) having its gate coupled to the first node (N31), said current-sinking transistor (MN1) having its gate coupled to the fourth node (N32).

7. A current mirror circuit as claimed in claim 1, wherein said first source follower transistor (MN34) is comprised of an N-channel MOS transistor.

8. A current mirror circuit as claimed in claim 7, wherein said second source follower transistor (MP35) is comprised of a P-channel MOS transistor.

9. A current mirror circuit as claimed in claim 8, wherein said current-sinking transistor (MN31) is comprised of an N-channel MOS transistor.

10. In a differential current source driver (500) for use in a networking communication physical layer CMOS integrated circuit device, which includes a pair of identical current source driver circuits (510*a*, 510*b*), each of said pair of current source driver circuits comprising:

a current mirror arrangement being formed of first and second P-channel MOS transistors (MP32,MP33), the gates of said first and second P-channel MOS transistors (MP32,MP33) being connected together and to the drain of said first P-channel MOS transistor (MP32), said first P-channel MOS transistor (MP32) having its source connected to a power supply potential and its drain connected to a first node (N31), said second P-channel MOS transistor (MP33) having its source connected to the power supply potential and its drain connected to a second node (N34);

input current source means ($I_{CS}$) for generating a variable current at said first node (N31);

a first source follower transistor (MN34) having its gate connected to the first node (N31), its drain connected to the power supply potential, and its source connected to a third node (N33);

a second source follower transistor (MP35) having its source connected to the second node (N34), its gate connected to the third node (N33), and its drain connected to a fourth node (N32);

a current sinking transistor (MN31) having its gate and drain connected together and to the fourth node (N32) and its source connected to a ground potential; and load circuit means (212) interconnected between the third node (N33) and the ground potential for receiving current from said first source follower transistor (MN34).

11. In a differential current source driver as claimed in claim 10, wherein said second source follower transistor (MP35) serves to maintain voltages at the first and second nodes (N31,N34) to be substantially equal so as to precisely mirror current from said first P-channel MOS transistor (MP32) to said second P-channel MOS transistor (MP33).

12. In a differential current source driver as claimed in claim 10, wherein said load circuit means (212) is comprised of a load transistor (MN36) functioning as a current-sinking transistor and a load resistor (R1).

13. In a differential current source driver as claimed in claim 12, wherein said load transistor (MN36) has its drain connected to the third node (N33), its gate connected to the fourth node (N32), and its source connected to the ground potential, said load resistor (R1) having its one end connected to the third node (N33) and its other end connected to the ground potential.

14. In a differential current source driver as claimed in claim 10, wherein said load circuit means (212) is comprised of a single load resistor.

15. In a differential current source driver as claimed in claim 10, further comprising an output stage formed of a current-sourcing transistor (MP32) and a current-sinking transistor (MN1), said current-sourcing transistor (MP2) having its gate coupled to the first node (N31), said current-sinking transistor (MN1) having its gate coupled to the fourth node (N32).

16. In a differential current source driver as claimed in claim 10, wherein said first source follower transistor (MN34) is comprised of an N-channel MOS transistor.

17. In a differential current source driver as claimed in claim 16, wherein said second source follower transistor (MP35) is comprised of a P-channel MOS transistor.

18. In a differential current source driver as claimed in claim 17, wherein said current-sinking transistor (MN31) is comprised of an N-channel MOS transistor.

* * * * *